United States Patent
Shishido et al.

(10) Patent No.: US 9,497,398 B2
(45) Date of Patent: *Nov. 15, 2016

(54) SOLID-STATE IMAGING DEVICE AND CAMERA FOR REDUCING RANDOM ROW NOISE

(71) Applicant: Panasonic Intellectual Property Management Co., Ltd., Osaka (JP)

(72) Inventors: Sanshiro Shishido, Osaka (JP); Masahiro Higuchi, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/003,410

(22) Filed: Jan. 21, 2016

(65) Prior Publication Data

US 2016/0142661 A1    May 19, 2016

Related U.S. Application Data

(60) Division of application No. 14/554,005, filed on Nov. 25, 2014, now Pat. No. 9,282,267, which is a
(Continued)

(30) Foreign Application Priority Data

May 30, 2012   (JP) .................................. 2012-122630

(51) Int. Cl.
*H04N 5/357*   (2011.01)
*H04N 5/365*   (2011.01)
(Continued)

(52) U.S. Cl.
CPC ......... *H04N 5/3658* (2013.01); *H03M 1/1245* (2013.01); *H04N 5/357* (2013.01);
(Continued)

(58) Field of Classification Search
CPC ................ H04N 5/3742; H04N 5/3651; H04N 5/37455; H04N 5/357; H04N 5/3658; H04N 5/378
(Continued)

(56) References Cited

U.S. PATENT DOCUMENTS 7,683,814 B2   3/2010   Maruyama
8,687,100 B2   4/2014   Toyama et al.
(Continued)

FOREIGN PATENT DOCUMENTS

JP   2008-187432 A   8/2008
JP   2008-244716 A   10/2008
(Continued)

OTHER PUBLICATIONS

International Search Report issued in International Application No. PCT/JP2013/002886 with Date of mailing Jul. 9, 2013, with English Translation.
(Continued)

*Primary Examiner* — Hung Lam
(74) *Attorney, Agent, or Firm* — McDermott Will & Emery LLP

(57) ABSTRACT

The solid-state imaging device includes a D/A converting circuit generating a reference voltage to be used for an A/D conversion. The D/A converting circuit includes: a voltage generating circuit generating an analog voltage according to a digital signal; a buffer circuit (a resistor ladder upper voltage supplying buffer circuit) which buffers the generated analog voltage, the buffer circuit sampling and holding a bias voltage generated inside the buffer circuit, and outputting the buffered analog voltage using the held bias voltage; an analog signal outputting unit (a resistor ladder unit) outputting the reference voltage according to the inputted digital signal, by receiving an output from the buffer circuit; and a pre-charge amplifier which charges a noise-reducing capacitor in conjunction with the sampling and holding by the buffer circuit, the noise-reducing capacitor being connected to the analog signal outputting unit.

7 Claims, 9 Drawing Sheets

Related U.S. Application Data continuation of application No. PCT/JP2013/002886, filed on Apr. 30, 2013.

(51) Int. Cl.
| | |
|---|---|
| *H04N 5/378* | (2011.01) |
| *H04N 5/374* | (2011.01) |
| *H04N 5/3745* | (2011.01) |
| *H03M 1/12* | (2006.01) |
| *H04N 5/369* | (2011.01) |

(52) U.S. Cl.
CPC .......... *H04N 5/3651* (2013.01); *H04N 5/3698* (2013.01); *H04N 5/378* (2013.01); *H04N 5/3742* (2013.01); *H04N 5/37455* (2013.01)

(58) Field of Classification Search
USPC ....... 348/272, 294, 314, 324, 302, 572–573; 341/155, 144; 250/208.1
See application file for complete search history.

(56) References Cited

U.S. PATENT DOCUMENTS

| | | |
|---|---|---|
| 8,803,600 B2 | 8/2014 | Hsu et al. |
| 9,066,031 B2 | 6/2015 | Murakami et al. |
| 2008/0043128 A1 | 2/2008 | Poonnen et al. |
| 2008/0239106 A1 | 10/2008 | Sano |
| 2009/0079603 A1 | 3/2009 | Maruyama |
| 2009/0179699 A1 | 7/2009 | Higuchi |
| 2011/0115959 A1 | 5/2011 | Toyama et al. |
| 2011/0169990 A1 | 7/2011 | Higuchi et al. |

FOREIGN PATENT DOCUMENTS

| | | |
|---|---|---|
| JP | 2009-171210 A | 7/2009 |
| JP | 2011-109282 A | 6/2011 |
| JP | 2012-029038 A | 2/2012 |

OTHER PUBLICATIONS

Notice of Allowance dated Nov. 2, 2015, issued in corresponding U.S. Appl. No. 14/554,005.

SOLID-STATE IMAGING DEVICE AND CAMERA FOR REDUCING RANDOM ROW NOISE

CROSS REFERENCE TO RELATED APPLICATIONS

This is a Divisional Application of U.S. patent application Ser. No. 14/554,005, filed on Nov. 25, 2014, now U.S. Pat. No. 9,282,267, which is a continuation application of PCT International Application No. PCT/JP2013/002886 filed on Apr. 30, 2013, designating the United States of America, which is based on and claims priority of Japanese Patent Application No. 2012-122630 filed on May 30, 2012. The entire disclosures of the above-identified applications, including the specifications, drawings and claims are incorporated herein by reference in their entirety.

FIELD

The present disclosure relates to a solid-state imaging device which includes a digital-to-analog (D/A) converting circuit and reads out pixel signals for each of groups of pixels, and to a camera including the solid-state imaging device.

BACKGROUND

In recent digital cameras, solid-state imaging devices (for example, complementary metal oxide semiconductor sensors, or CMOS sensors) have an increasing number of pixels due to reduction in pixel cell size. The mainstream of the market is high-definition solid-state imaging devices including 10 million pixels or more. In order to implement a read-out technique for these high-definition solid-state imaging devices, a typical approach is to utilize a column parallel analog-to-digital (hereinafter referred to as "A/D") converting solid-state imaging device as described in Patent Literature 1 (PTL 1). The device includes A/D converting circuits each provided to a corresponding one of columns of pixel arrays, and performs A/D conversions, at a time in a horizontal scanning period, on pixel output signals for one row of pixel array. As this column parallel A/D converting circuit, a single-slope A/D converting circuit whose circuit size is relatively small is typically used, due to an area limitation, for each column, determined based on dot pitch. In recent years, a burst mode and a video capturing mode of digital still cameras are familiar as functions with extra values. Such functions are benefits brought by the column parallel A/D converting solid-state imaging device.

However, the column parallel A/D converting solid-state imaging device develops random jitter—that is, what is referred to as random row noise—for each row in image data, due to random jitter of a reference signal applied in a horizontal direction with respect to a pixel array. In recognizing images, human eyes sensitively recognize patterns in vertical and horizontal directions and temporal jitter. Hence, it is particularly important for the column parallel A/D converting solid-state imaging device to reduce the random row noise.

CITATION LIST

Patent Literature

[PTL 1]
Japanese Unexamined Patent Application Publication No. 2011-109282

SUMMARY

Technical Problem

However, the solid-state imaging device disclosed in PTL 1 has a problem of a decrease in operation speed caused by an additional capacitor used for reduction of more random row noise.

One non-limiting and exemplary embodiment provides a solid-state imaging device and a camera which make it possible to achieve a balance between reduction in random row noise and increase in operation speed.

Solution to Problem

A solid-state imaging device according to an aspect of the present invention includes: a pixel unit having pixels arranged in a matrix, the pixels performing photoelectric conversion; a read-out circuit which reads out pixel signals from the pixel unit for each of groups of the pixels, and performs an A/D conversion on the read pixel signals; and a D/A converting circuit which generates a reference voltage to be used for the A/D conversion by the read-out circuit. The D/A converting circuit includes: a voltage generating circuit which receives a bias voltage, and generates an analog voltage according to a value of an inputted digital signal; a buffer circuit which buffers the generated analog voltage, the buffer circuit sampling and holding a bias voltage generated inside the buffer circuit, and outputting the buffered analog voltage using the held bias voltage; an analog signal outputting unit which outputs the reference voltage by receiving an output from the buffer circuit and generating an output voltage according to the inputted digital signal; and a pre-charge circuit which charges a noise-reducing capacitor in conjunction with the sampling and holding, the noise-reducing capacitor being connected to the buffer circuit and the analog signal outputting unit.

Hence, the noise-reducing capacitor connected to the analog signal outputting unit is charged in conjunction with the sampling and holding performed by the buffer circuit. This makes it possible to achieve a balance between reduction in random row noise caused by generation of a ramp waveform and increase in operation speed at the change in slope of a ramp waveform, such as a change in gain.

Specifically, during a sampling period of the buffer circuit, the noise-reducing capacitor can be pre-charged while the noise-reducing capacitor is disconnected from the buffer circuit and the analog signal outputting unit. This can avoid deterioration of responsiveness caused by connection of a capacitor load to the buffer circuit. Then, during a holding period of the buffer circuit, the noise-reducing capacitor can be connected with buffer circuit and the analog signal outputting unit. This can reduce noise which appears in an output of the D/A converting circuit.

Here, the buffer circuit may include: a bias voltage supplying unit which supplies the bias voltage; a sample and hold circuit which samples and holds the supplied bias voltage, and outputs the held bias voltage; an amplifier circuit which amplifies the analog voltage generated by the voltage generating circuit; and an output circuit which outputs a signal according to an output from the amplifier circuit, under control by the bias voltage outputted from the sample and hold circuit. Here, the sample and hold circuit may include: a sample and hold switch connected between a bias line and a control terminal of the output circuit, the bias line supplying the bias voltage from the bias voltage supplying unit; and a sample and hold capacitor connected to the control terminal of the output circuit, and, during a sampling period, the sample and hold circuit may keep the sample and hold switch on, and charges the sample and hold capacitor with the bias voltage.

Hence, during the holding period of the buffer circuit, the sample and hold switch disconnects the output circuit from a circuit disposed in a stage preceding the output circuit. This can avoid propagation of noise, generated by a circuit in a preceding stage, to the analog signal outputting unit.

Moreover, the analog signal outputting unit may include: a resistor ladder unit configured to receive the output from the buffer circuit; a resistor ladder selection switching unit configured to select any one of connection points in the resistor ladder unit; and a D/A outputting circuit which outputs a voltage at the selected one of the connection points, and the analog signal outputting unit may receive the inputted digital signal and a voltage applied across the resistor ladder unit, and output a voltage resistively divided by the resistor ladder unit and corresponding to the digital signal.

Hence, the analog signal outputting unit (i) includes the resistor ladder unit which receives an output, across the resistor ladder unit, from the buffer circuit, and (ii) outputs a voltage which is resistively divided according to an inputted digital signal. This allows a pixel signal to be converted from analog to digital, using a reference voltage faithful to the inputted digital signal.

Furthermore, the pre-charge circuit may include: a pre-charge amplifier which charges the noise-reducing capacitor; a first switch which connects the pre-charge amplifier with the noise-reducing capacitor; a second switch which connects the analog signal outputting unit with the noise-reducing capacitor; and a logic circuit which controls the first switch and the second switch, in conjunction with the sampling and holding by the buffer circuit. During a holding period in the sampling and holding, the pre-charge circuit may connect the analog signal outputting unit and the buffer circuit to the noise-reducing capacitor, and, during a sampling period in the sampling and holding, the pre-charge circuit may (i) disconnect the analog signal outputting unit and the buffer circuit from the noise-reducing capacitor, and (ii) cause the pre-charge amplifier to charge the noise-reducing capacitor.

Hence, during a holding period of the buffer circuit, the analog signal outputting unit and the buffer circuit are connected with the noise-reducing capacitor. This can reduce noise which appears in an output of the D/A converting circuit. Moreover, during a sampling period of the buffer circuit, the analog signal outputting unit and the buffer circuit are disconnected from the noise-reducing capacitor, and the noise-reducing capacitor is charged by the pre-charge amplifier. This can increase an operation speed.

In addition, the read-out circuit may include: comparators each of which is provided to a corresponding one of columns of the pixels in the pixel unit, and compares the reference voltage with a potential of each of the pixel signals outputted from the pixels of the corresponding one of the columns; counters each of which is a circuit provided to a corresponding one of the comparators, each of the counters (i) counting a comparison time at a corresponding one of the comparators, and (ii) stopping the counting when an output of the corresponding one of the comparators inverts; and digital memories each of which is provided to a corresponding one of the counters and holds a count value of the corresponding one of the counters.

Hence, a column parallel A/D converting solid-state imaging device is implemented. Such a solid-state imaging device can implement a digital still camera having extra values such as a burst mode and a video capturing mode.

It is noted that the present disclosure may be implemented not only as a solid-state imaging device, but also as an A/D converting circuit included in the solid-state imaging device, as well as a digital camera etc. including the solid-state imaging device. For example, the present disclosure may be implemented as a camera including the above solid-state imaging device and an optical system which forms an object image in the solid-state imaging device.

Advantageous Effects

A solid-state imaging device and a camera according to the present disclosure can achieve a balance between reduction in random row noise caused by generation of a ramp waveform and increase in operation speed at the change in slope of a ramp waveform, such as a change in gain.

BRIEF DESCRIPTION OF DRAWINGS

These and other objects, advantages and features of the invention will become apparent from the following description thereof taken in conjunction with the accompanying drawings that illustrate a specific embodiment of the present invention.

DESCRIPTION OF EMBODIMENTS

Underlying Knowledge Forming Basis of the Present Disclosure

First, a problem is described of a conventional column parallel A/D converting solid-state imaging device disclosed in PTL 1, with reference to the drawings.

Figure 1:
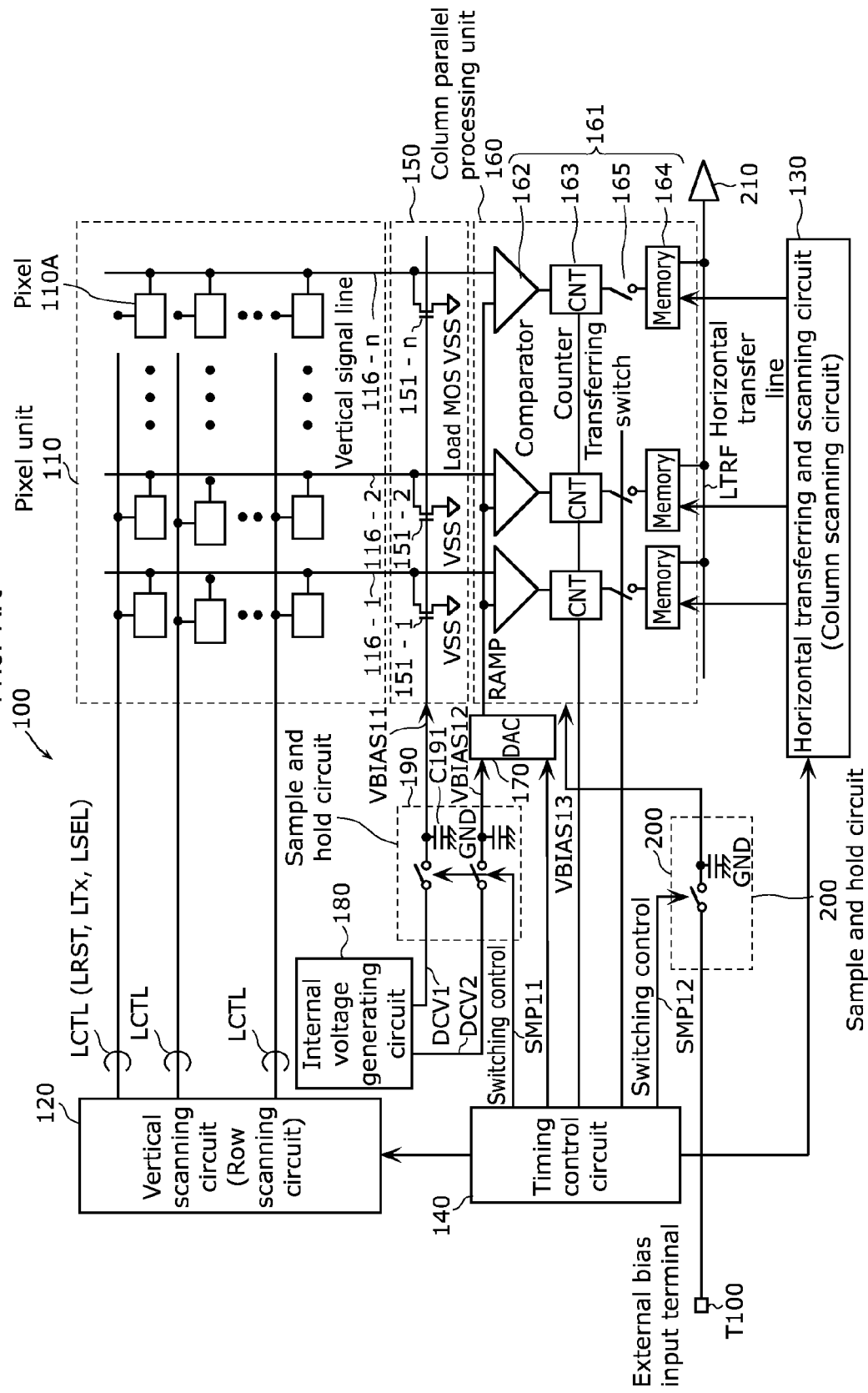
FIG. 1 is a block diagram illustrating an exemplary configuration of a conventional column parallel A/D converting solid-state imaging device.

FIG. 1 is a block diagram illustrating an exemplary configuration of a conventional column parallel A/D converting solid-state imaging device 100 disclosed in PTL 1. The solid-state imaging device 100 includes a pixel unit 110, a vertical scanning circuit (row scanning circuit) 120, a horizontal transferring and scanning circuit (column scanning circuit) 130, a load circuit 150, and a column parallel processing unit 160 having a group of analog-to-digital converters. Furthermore, the solid-state imaging device 100 includes a D/A converting circuit (DAC) 170, an internal voltage generating circuit 180, and a timing control circuit 140.

The pixel unit 110 has pixels 110A arranged in matrix. Each of the pixels 110A includes a photo diode (photoelectric converting device) and an in-pixel amplifier.

In the pixel unit 110, pixels 110A arranged on the same row are connected to the same row control line LCTL. Pixels 110A arranged on the same column are connected to a corresponding one of vertical signal lines 116-1 to 116-*n*.

The load circuit 150 includes load MOS transistors 151-1 to 151-*n*. In association with an arrangement of pixels in a column, each of the load MOS transistors 151-1 to 151-*n* has (i) a drain connected to a corresponding one of the vertical signal lines 116-1 to 116-*n*, and (ii) a source connected to a corresponding one of reference potentials VSS.

Then, the load MOS transistors 151-1 to 151-*n* have gates connected in common to a supply line of a bias voltage VBIAS 11 to be generated by the internal voltage generating circuit 180.

The load MOS transistors 151-1 to 151-*n* work as current sources for source followers in read-out of pixel signals.

In the column parallel processing unit 160, columns of column processing circuits 161 are arranged. A column processing circuit 161 for each column forms an ADC.

Each of column processing circuits (ADCs) 161 includes a comparator 162 which compares a reference signal RAMP (Vslop) with an analog signal VSL. The reference signal RAMP is the reference signal generated by the D/A converting circuit 170 and changed stepwise into a ramp waveform. The analog signal VSL is obtained for each row line from a pixel via a vertical signal line.

Furthermore, each of the column processing circuits 161 includes a counter 163 which counts a comparison time at the comparator 162, a memory (latch) 164 which holds a result of the count by the counter 163, and a switch 165 which connects the counter 163 with the memory (latch) 164.

It is noted that a bias voltage VBIAS 13, which is inputted at an external bias input terminal T100, is supplied to a gate of a transistor that works as a current source for a differential pair transistor of the comparator 162.

Each of the column processing circuits 161 has an n-bit digital signal conversion function, and is provided to a corresponding one of the vertical signal line (column line) 116-1 to 116-*n*. Such features form a column parallel A/D converting block.

An output of each memory 164 is, for example, connected to a horizontal transfer line having a k-bit width.

The D/A converting circuit 170 is supplied with a bias voltage VBIAS 12 generated by the internal voltage generating circuit 180, and generates the reference signal RAMP (Vslop) from a reference signal whose waveform is changed into a step-like ramp waveform. Then the D/A converting circuit 170 supplies the reference signal RAMP (Vslop) to the comparator 162 of each column processing circuit 161.

The timing control circuit 140 controls a processing time point etc. for each of the vertical scanning circuit 120, the horizontal transferring and scanning circuit 130, the column parallel processing unit 160, and the D/A converting circuit 170.

Figure 2:
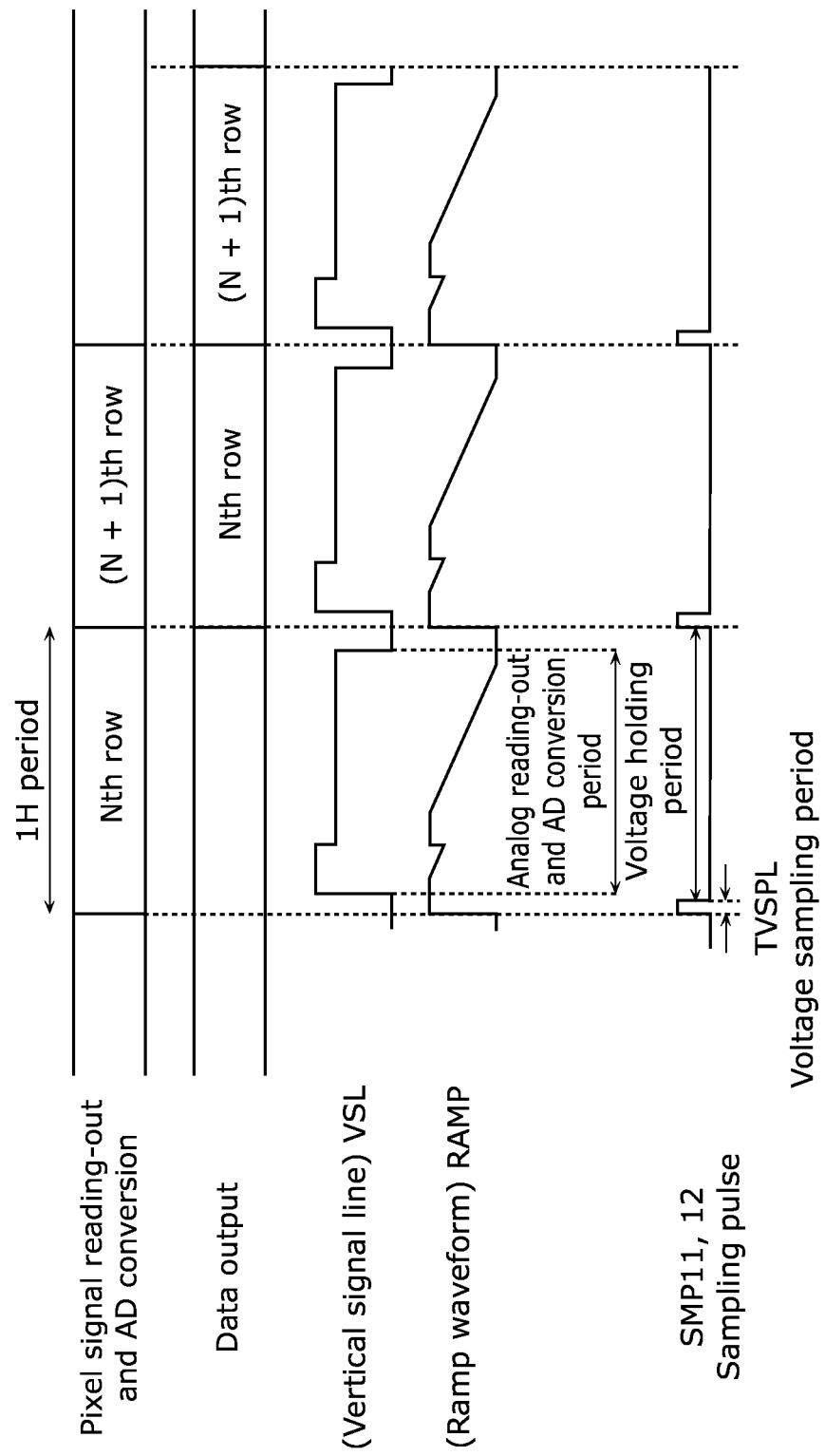
FIG. 2 is a timing diagram illustrating an operation of the conventional solid-state imaging device illustrated in FIG. 1.

FIG. 2 is a timing diagram illustrating an operation of the conventional solid-state imaging device 100 illustrated in FIG. 1.

At each of the column processing circuit (ADC) 161, an analog signal (potential VSL) read out to the vertical signal line 116 is compared by the comparator 162, arranged for each column, with the reference signal RAMP whose waveform changes stepwise.

Here, the counter 163 continues counting, until a level of the reference signal RAMP (Vslop) exceeds or falls below a level of the analog potential VSL and the output of the comparator 162 inverts. Hence, the potential (analog signal) VSL of the vertical signal line 116 is converted into a digital signal (A/D conversion).

The A/D conversion is performed twice for each read-out. First A/D conversion is performed when a reset level (P-phase) of a pixel 110A is read out to a vertical signal line 116 (for each of 116-1 to 116-*n*). This reset level p-phase includes a variation for each pixel. The second A/D conversion is performed when a signal, which is photo-electrically converted into by each pixel 110A, is read out to the vertical signal line 116 (for each of 116-1 to 116-*n*) (D-phase). Since the D-phase also includes a variation for each pixel, processing to calculate a difference of the levels between the phases (D-phase level–P-phase level) is performed and thus correlated double sampling (CDS) is implemented.

The signals converted into the digital signals are recorded on the memories 164, sequentially read out to an output unit 210 by the horizontal transferring and scanning circuit 130 via a horizontal transfer line, and finally outputted.

This is how column parallel outputting processing is performed.

Hence, the conventional solid-state imaging device 100 includes: a read-out unit which reads out pixel signals from the pixel unit 110 and includes an A/D conversion function for performing an A/D conversion; sample and hold circuits 190 and 200 which (i) sample a bias voltage, generated by the internal voltage generating circuit 180, during a period depending on a control signal, and (ii) supply the sampled bias voltage to the read-out unit; and a timing control circuit 140. Here, the read-out unit includes a circuit which operates by receiving the supply of the generated bias voltage, and the timing control circuit 140 controls so that the voltage is sampled by the sample and hold circuits 190 and 200 out of at least one of an analog signal read-put period and an A/D conversion period.

As described above, in a circuit which supplies a voltage in a horizontal direction with respect to the column processing circuit 161, the conventional solid-state imaging device 100 performs a bias voltage sample and hold operation which involves voltage sampling out of at least one of the analog signal read-out period and the A/D conversion period. Such features can stop routing, to a column processing system, circuit noise and external noise coming from outside which cause image deterioration.

However, the conventional solid-state imaging device has a problem of a decrease in operation speed caused by an additional capacitor used for further reduction of random row noise.

One non-limiting and exemplary embodiment provides a solid-state imaging device and a camera which make it possible to achieve a balance between reduction in random row noise and increase in operation speed. A solid-state imaging device according to an implementation of the present invention includes: a pixel unit having pixels arranged in a matrix, the pixels performing photoelectric conversion; a read-out circuit which reads out pixel signals from the pixel unit for each of groups of the pixels, and performs an A/D conversion on the read pixel signals; and a D/A converting circuit which generates a reference voltage to be used for the A/D conversion by the read-out circuit. The D/A converting circuit includes: a voltage generating circuit which receives a bias voltage, and generates an analog voltage according to a value of an inputted digital signal; a buffer circuit which buffers the generated analog voltage, the buffer circuit sampling and holding a bias voltage generated inside the buffer circuit, and outputting the buffered analog voltage using the held bias voltage; an analog signal outputting unit which outputs the reference voltage by receiving an output from the buffer circuit and generating an output voltage according to the inputted digital signal; and a pre-charge circuit which charges a noise-reducing capacitor in conjunction with the sampling and holding, the noise-reducing capacitor being connected to the buffer circuit and the analog signal outputting unit.

Hence, the noise-reducing capacitor connected to the analog signal outputting unit is charged in conjunction with the sampling and holding performed by the buffer circuit. This makes it possible to achieve a balance between reduction in random row noise caused by generation of a ramp waveform and increase in operation speed at the change in slope of a ramp waveform, such as a change in gain.

EMBODIMENTS

Hereinafter, a solid-state imaging device and a camera according to embodiments of the present disclosure are disclosed with reference to the drawings. Any one of the embodiments below is an example of the present disclosure. The numerical values, shapes, materials, constituent elements, arrangement positions of and connecting schemes between the constituent elements, steps, and an order of the steps all described in the embodiments are examples, and shall not limit the present disclosure. Furthermore, among the constituent elements in the embodiments, those not described in an independent claim representing the most generic concept of the present disclosure are introduced to implement given constituent elements.

The description is stated in the following order:
  1. Embodiment 1 (First Exemplary Configuration of Solid-State Imaging Device);
  2. Embodiment 2 (Second Exemplary Configuration of Solid-State Imaging Device); and
  3. Embodiment 3 (Exemplary Configuration of Camera)

Embodiment 1

Figure 3:
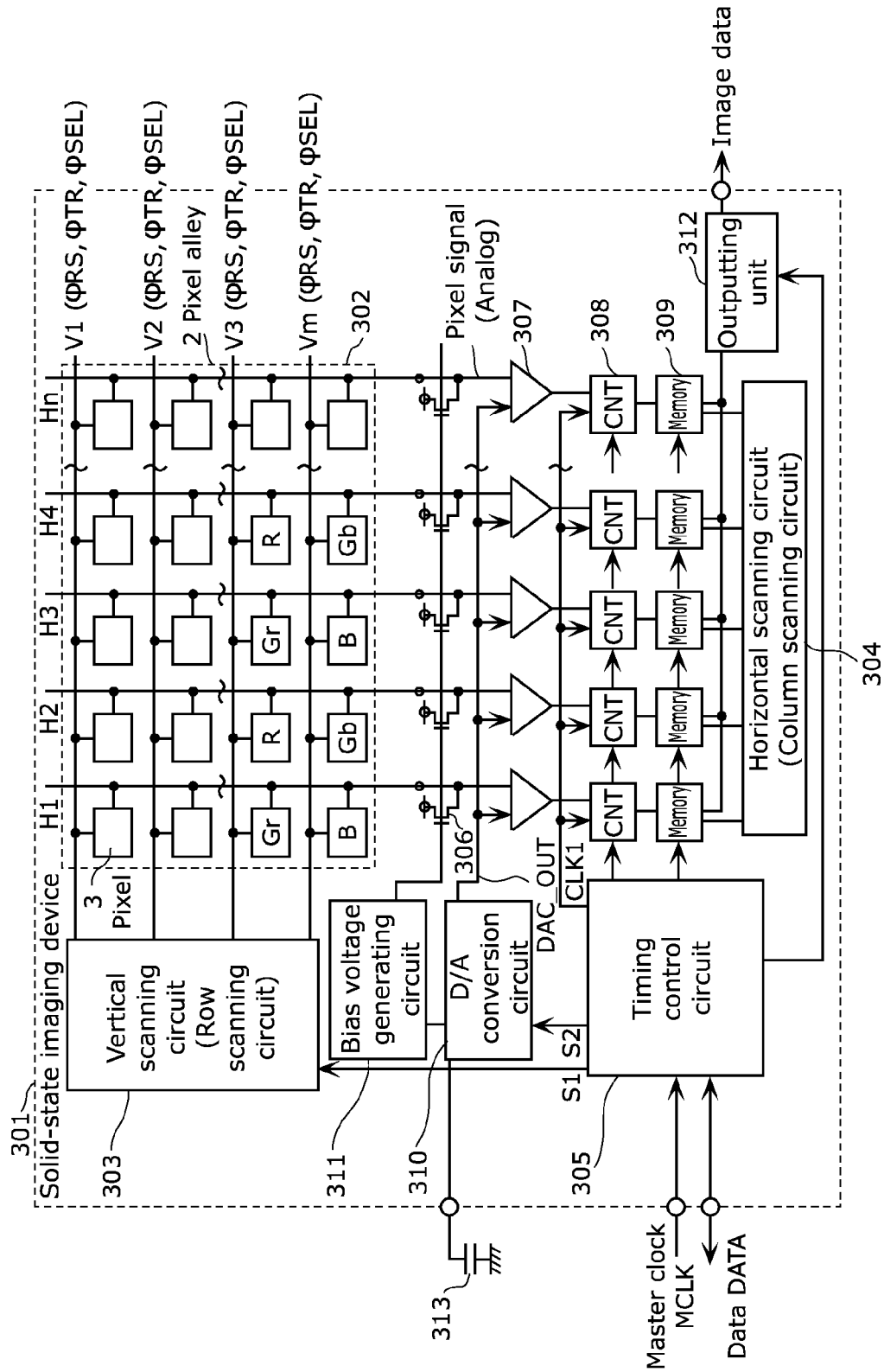
FIG. 3 is a block diagram illustrating an exemplary configuration of solid-state imaging devices according to Embodiments 1 and 2 of the present disclosure.

FIG. 3 is a block diagram illustrating an exemplary configuration of a solid-state imaging device 301 employing column parallel A/D converting technique according to the present disclosure.

In FIG. 3, the solid-state imaging device 301 is a CMOS image sensor, for example. The solid-state imaging device 301 includes: (i) a pixel unit 302 which works as an imaging unit and has pixels arranged in a matrix, the pixels performing photoelectric conversion; (ii) a read-out circuit (a vertical scanning circuit (a row scanning circuit) 303, a horizontal transferring and scanning circuit (a column scanning circuit) 304, a timing control circuit 305, column current source loads 306 each provided to a corresponding one of columns, comparators 307 each provided to a corresponding one of the columns, counters 308 each provided to a corresponding one of the columns, digital memories 309 each provided to a corresponding one of the columns, a bias voltage generating circuit 311, and an outputting unit 312) which reads out pixel signals from the pixel unit 302 for each of groups of the pixels and performs an A/D conversion on the read pixel signals; and (iii) a D/A conversion circuit 310 which generates a reference voltage to be used for the A/D conversion performed by the read-out circuit. It is noted that a noise-reducing capacitor 313 provided outside the solid-state imaging device 301 is connected to the D/A conversion circuit 310 of the solid-state imaging device 301.

As main constituent elements, the above read-out circuit includes: (i) comparators 307 each of which is provided to a corresponding one of the columns of pixels included in the pixel unit 302, and compares the reference voltage to be used for the A/D conversion with a potential of each of the pixel signals outputted from the pixels of the corresponding one of the columns; (ii) counters 308 each of which is a circuit provided to a corresponding one of the comparators 307, each of the counters 308 counting a comparison time at a corresponding one of the comparators 307, and stopping the counting when an output of the corresponding one of the comparators 307 inverts; and (iii) digital memories 309 each of which is provided to a corresponding one of the counters 308 and holds a count value at the corresponding one of the counters 308.

Figure 4:
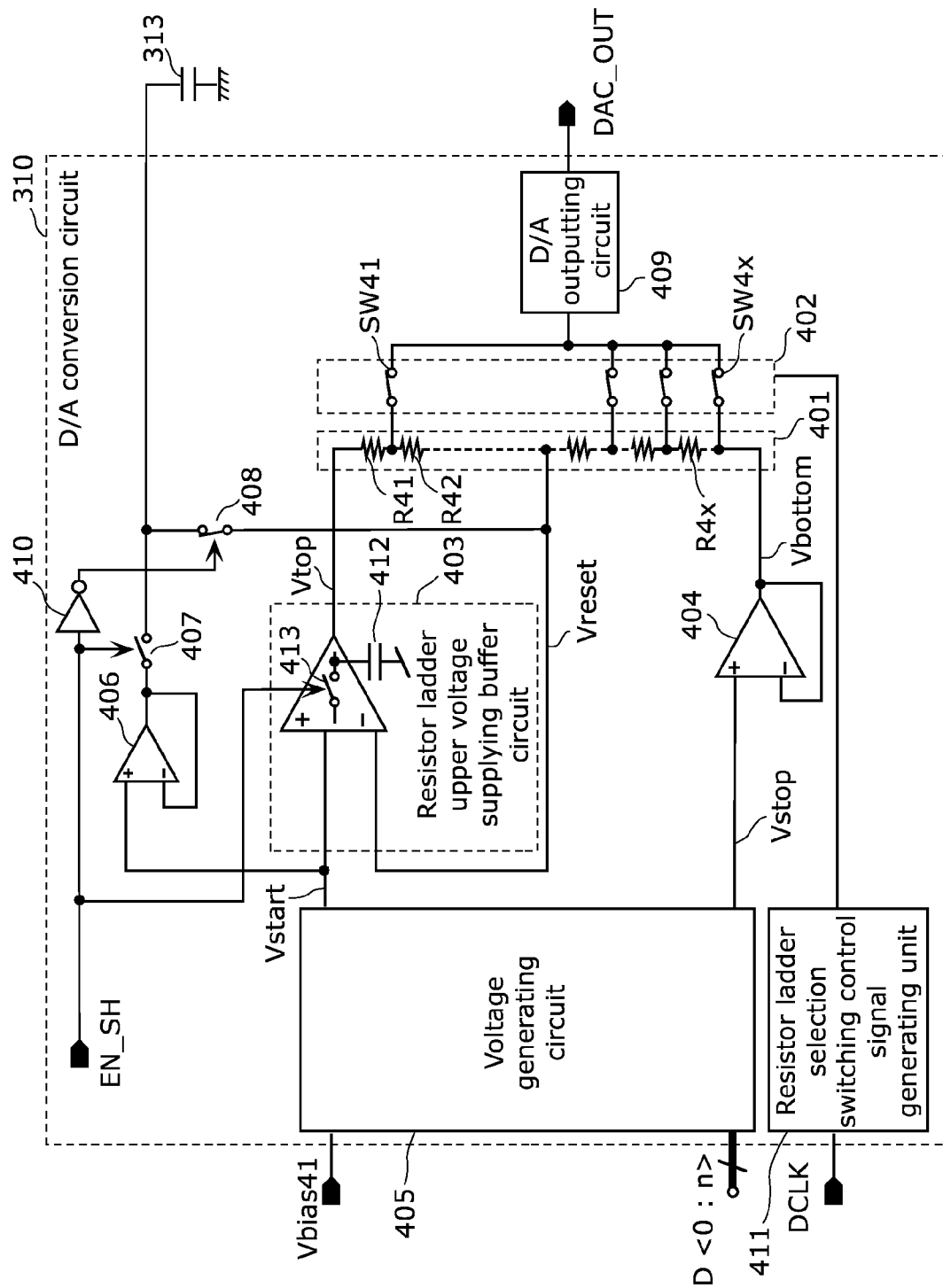
FIG. 4 is a diagram illustrating an exemplary configuration of a D/A converting circuit included in the solid-state imaging device according to Embodiment 1.

FIG. 4 is a diagram illustrating an exemplary configuration of the D/A conversion circuit 310 included in the solid-state imaging device 301 illustrated in FIG. 3. The D/A conversion circuit 310 according to Embodiment 1 includes: a resistor ladder unit 401 which is a group of resistors connected in series, a resistor ladder selection switching unit 402, a resistor ladder upper voltage supplying buffer circuit 403, a resistor ladder lower voltage supplying buffer circuit 404, a voltage generating circuit 405, a pre-charge amplifier 406, an amplifier-side noise-reducing capacitor connecting switch 407, a resistor-ladder-side noise-reducing capacitor connecting switch 408, a D/A outputting circuit 409, an inverter 410, and a resistor ladder selection switching control signal generating unit 411.

In other words, as main constituent elements, the D/A conversion circuit 310 includes: (i) a voltage generating circuit 405 which receives a bias voltage and generates an analog voltage according to a value of an inputted digital signal; (ii) a buffer circuit which buffers the generated analog voltage (the resistor ladder upper voltage supplying buffer circuit 403 and the resistor ladder lower voltage supplying buffer circuit 404), the buffer circuit sampling and holding a bias voltage generated inside the buffer circuit and outputting the buffered analog voltage using the held bias voltage; (iii) an analog signal outputting unit (the resistor ladder unit 401, the resistor ladder selection switching unit 402, and the D/A outputting circuit 409) which outputs the reference voltage to be used for the A/D conversion, by receiving the output from the buffer circuit and generating an output voltage according to the inputted digital signal; and (iv) a pre-charge circuit (the pre-charge amplifier 406, the amplifier-side noise-reducing capacitor connecting switch 407, the resistor-ladder-side noise-reducing capacitor connecting switch 408, and the inverter 410) which charges the noise-reducing capacitor 313 in conjunction with the sampling and holding performed by the buffer circuit (the resistor ladder upper voltage supplying buffer circuit 403), the noise-reducing capacitor 313 being connected to the buffer circuit (the resistor ladder upper voltage supplying buffer circuit 403) and to the analog signal outputting unit.

Hereinafter, the solid-state imaging device 301 according to Embodiment 1 is described with a focus on differences between the solid-state imaging device 301 and the conventional solid-state imaging device 100.

The resistor ladder upper voltage supplying buffer circuit 403, one of the above buffer circuits, includes a sample and hold capacitor 412 and a sample and hold switch 413 both for a sample and hold operation.

It is noted that, in the D/A conversion circuit 310, a bias voltage Vbias 41 and a digital signal D<0:n> of n+1 bit are supplied to the voltage generating circuit 405 from outside of the D/A conversion circuit 310, and a digital signal DCLK is supplied to the resistor ladder selection switching control signal generating unit 411. With respect to the inputted bias voltage Vbias 41, the voltage generating circuit 405 provides a resistor ladder upper voltage Vstart to a non-inverting input terminal (a positive terminal) of the resistor ladder upper voltage supplying buffer circuit 403, and a resistor ladder lower voltage Vstop to a non-inverting input terminal (a positive terminal) of the resistor ladder lower voltage supplying buffer circuit 404. The resistor ladder upper voltage supplying buffer circuit 403 has an output terminal connected to a resistor ladder end Vtop of the resistor ladder unit 401. In contrast, the resistor ladder lower voltage supplying buffer circuit 404 has an output terminal connected not to the connection destination of the output terminal of the resistor ladder upper voltage supplying buffer circuit 403 but to a resistor ladder end Vbottom of the resistor ladder unit 401.

A resistor ladder middle Vreset terminal, which is a central connection point of the resistor ladder unit 401, is connected to an inverted input terminal of the resistor ladder upper voltage supplying buffer circuit 403.

The resistor ladder lower voltage supplying buffer circuit 404, which is the other one of the buffer circuits, has the output terminal and an inverted input terminal connected with each other, and forms a unity-gain buffer circuit which makes a voltage gain of 1.

The resistor ladder unit 401, the resistor ladder selection switching unit 402, and the D/A outputting circuit 409 form the above-described analog signal outputting unit. In other words, the analog signal outputting unit includes: (i) the resistor ladder unit 401 that receives an output, across the resistor ladder unit 401, from the above-described buffer circuit (the resistor ladder upper voltage supplying buffer circuit 403 and the resistor ladder lower voltage supplying buffer circuit 404); (ii) the resistor ladder selection switching unit 402 that selects any one of the multiple connection points in the resistor ladder unit 401; and (iii) the D/A outputting circuit 409 that outputs a voltage at the selected one of the connection points. The analog signal outputting unit receives a digital signal and a voltage applied across the resistor ladder unit 401, and outputs, as a reference voltage to be used for A/D conversion, a voltage resistively divided by the resistor ladder unit 401 and corresponding to the digital signal.

The resistor ladder unit 401 includes multiple (x number of) resistors (resistors R41 to R4x) connected in series between the resistor ladder end Vtop to the resistor ladder end Vbottom.

The resistor ladder selection switching unit 402 includes x number of switches SW41 to SW4x each corresponding to one of the x number of resistors R41 to R4x so that the SW41 is connected to a connection point of the resistors R41 and R42. For the resistor ladder selection switching unit 402, all the terminals on the other side of the connections to the resistor ladder unit 401 are connected to the D/A outputting circuit 409 as a single terminal.

The D/A outputting circuit 409 is a buffer amplifier which outputs a voltage, inputted via the resistor ladder selection switching unit 402, as an output DAC_OUT of the D/A conversion circuit 310.

In the above-configured resistor-ladder D/A conversion circuit 310, the buffer circuit (the resistor ladder upper voltage supplying buffer circuit 403 and the resistor ladder lower voltage supplying buffer circuit 404) determines a voltage across the resistor ladder unit 401, and, furthermore, the resistor ladder selection switching unit 402 selects any given switch for conduction. Then, a resistively divided voltage is outputted as the output DAC_OUT via the D/A outputting circuit 409.

The D/A conversion circuit 310 according to Embodiment 1 is connected to the noise-reducing capacitor 313 provided on the same semiconductor substrate or out of the semiconductor substrate. The noise-reducing capacitor 313 is connected to an output terminal of the pre-charge amplifier 406 via the amplifier-side noise-reducing capacitor connecting switch 407. Moreover, the noise-reducing capacitor 313 is connected to the resistor ladder middle Vreset terminal and the inverted input terminal of the resistor ladder upper voltage supplying buffer circuit 403 via the resistor-ladder-side noise-reducing capacitor connecting switch 408. Along with a resistor in the resistor ladder unit 401, the noise-reducing capacitor 313 connected to the resistor ladder middle Vreset terminal functions as an RC low-pass filter. Moreover, as a bypass capacitor, the noise-reducing capacitor 313 reduces noise generated at the D/A conversion circuit 310 by suppressing variations in potential.

Furthermore, as the pre-charge circuit of the noise-reducing capacitor 313, the D/A conversion circuit 310 includes the pre-charge amplifier 406, the amplifier-side noise-reducing capacitor connecting switch 407, the resistor-ladder-side noise-reducing capacitor connecting switch 408, and the inverter 410. The pre-charge amplifier 406 has the inverted input terminal and the output terminal connected with each other, and forms a unity-gain buffer circuit which makes a voltage gain of 1.

In other words, the above-described pre-charge circuit includes: (i) the pre-charge amplifier 406 that charges the noise-reducing capacitor 313; (ii) the amplifier-side noise-reducing capacitor connecting switch 407 that works as a first switch and connects the pre-charge amplifier 406 with the noise-reducing capacitor 313; (iii) the resistor-ladder-side noise-reducing capacitor connecting switch 408 that works as a second switch and connects the analog signal outputting unit (the resistor ladder unit 401) with the noise-reducing capacitor 313; and (iv) the inverter 410 that works as a logic circuit and controls the amplifier-side noise-reducing capacitor connecting switch 407 and the resistor-ladder-side noise-reducing capacitor connecting switch 408, in conjunction with sampling and holding by the resistor ladder upper voltage supplying buffer circuit 403. During a holding period of the resistor ladder upper voltage supplying buffer circuit 403, the pre-charge circuit connects the resistor ladder unit 401 and the resistor ladder upper voltage supplying buffer circuit 403 to the noise-reducing capacitor 313. In contrast, during a sampling period of the resistor ladder upper voltage supplying buffer circuit 403, the pre-charge circuit (i) disconnects the resistor ladder unit 401 and the resistor ladder upper voltage supplying buffer circuit 403 from the noise-reducing capacitor 313, and (ii) causes the pre-charge amplifier 406 to charge the noise-reducing capacitor 313.

Figure 5:
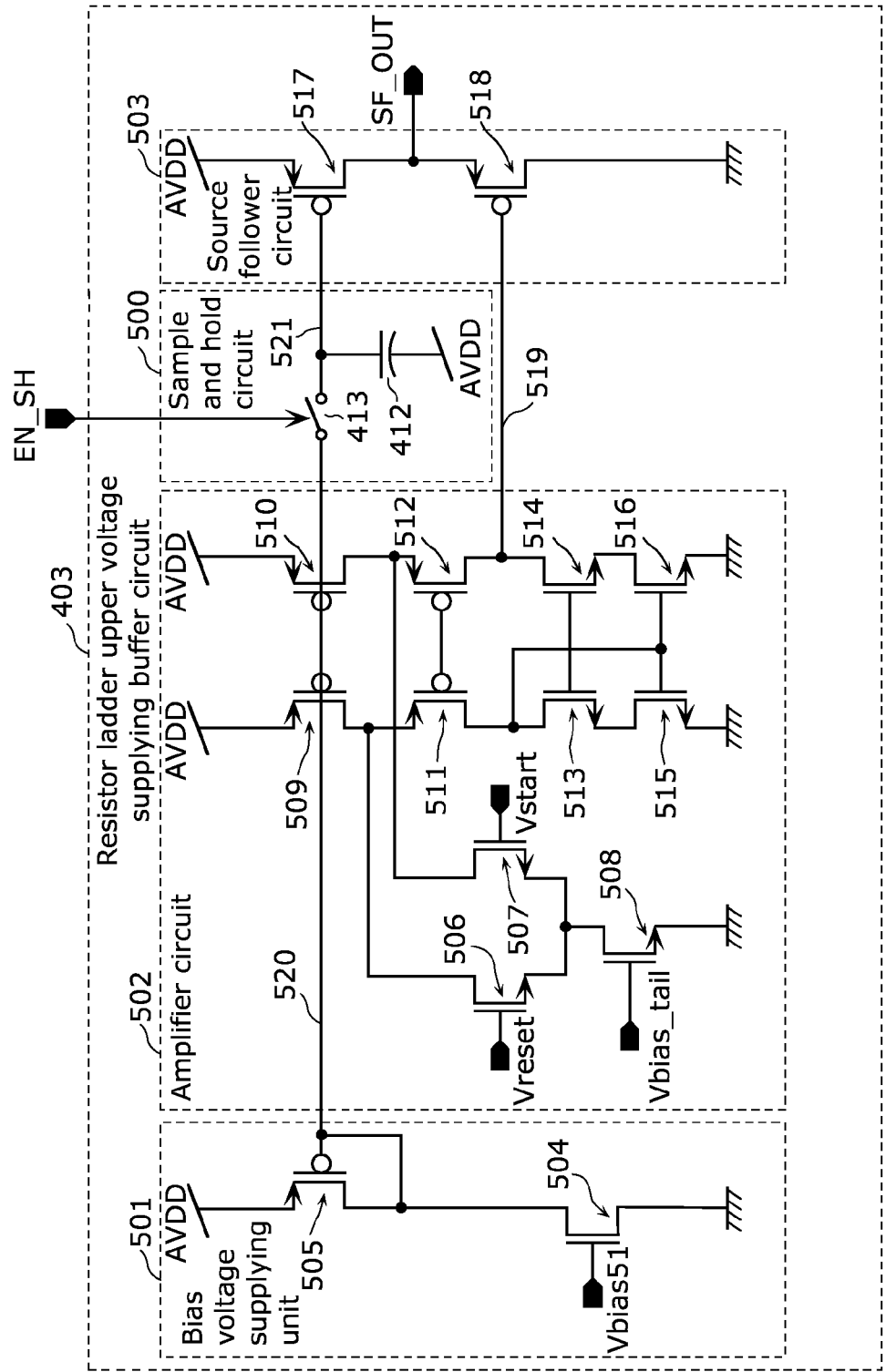
FIG. 5 is a circuit diagram of a resistor ladder upper voltage supplying buffer circuit in the D/A converting circuit illustrated in FIG. 4.

FIG. 5 is a circuit diagram illustrating details of the resistor ladder upper voltage supplying buffer circuit 403 in the D/A converting circuit 301 illustrated in FIG. 4. The resistor ladder upper voltage supplying buffer circuit 403 includes: a bias voltage supplying unit 501; an amplifier circuit 502; a source follower circuit 503; the sample and hold capacitor 412; and the sample and hold switch 413.

In other words, the resistor ladder upper voltage supplying buffer circuit 403 generally includes: (i) the bias voltage supplying unit 501 that supplies a bias voltage; (ii) a sample and hold circuit 500 (the sample and hold capacitor 412 and the sample and hold switch 413) which samples and holds the supplied bias voltage, and outputs the held bias voltage; (iii) the amplifier circuit 502 that amplifies the analog voltage (the resistor ladder upper voltage Vstart) generated by the voltage generating circuit 405; and (iv) the source follower circuit 503 that works as an output circuit, and, under the control by the bias voltage outputted from the sample and hold circuit 500, outputs a signal according to an output from the amplifier circuit 502. In details, the sample and hold circuit 500 includes: (i) the sample and hold switch 413 connected between a bias line (a wire 520) and a control terminal (or a wire 521) of the source follower circuit 503, the bias line supplying the bias voltage from the bias voltage supplying unit 501; and (ii) the sample and hold capacitor 412 connected to the control terminal (or the wire 521) of the source follower circuit 503. During a sampling period, the sample and hold circuit 500 keeps the sample and hold switch 413 on, and charges the sample and hold capacitor 412 with the bias voltage from the bias voltage supplying unit 501.

The bias voltage supplying unit 501 includes: an n-channel MOS (NMOS) transistor 504 which generates a current when receiving a bias voltage Vbias 51 supplied from outside the resistor ladder upper voltage supplying buffer circuit 403; and a p-channel MOS (PMOS) transistor 505 from which a current is copied for a current mirror.

The amplifier circuit 502 includes: a differential input amplifying transistor 506 having a gate to which a voltage Vreset inputted from the inverted input terminal is applied; a differential input amplifying transistor 507 having a gate to which a voltage Vstart inputted from a non-inverting input terminal is applied; a transistor 508 having a gate to which a bias voltage Vbias_tail is applied; and transistors 509 to 516 forming a folded cascade amplifier together with the transistors 506 to 508.

A wire 519 as an output for the amplifier circuit 502 is connected to a gate of a PMOS amplifying transistor 518 which forms the source follower circuit 503. A wire 520 connected to the gate terminal and the drain terminal of the transistor 505 of the bias voltage supplying unit 501 is connected through the sample and hold switch 413 to a gate of a PMOS transistor 517 which forms the source follower circuit 503 and works as a current source load. The sample and hold capacitor 412 is connected, in series with respect to a power source potential AVDD, to a wire 521 between the sample and hold switch 413 and the gate of the PMOS transistor 517.

The source follower circuit 503 includes PMOS transistors 517 and 518. The PMOS transistors 517 and 518 are connected in series between a power source potential AVDD and a ground potential GND. From the connection point, an output voltage SF_OUT is taken out.

The PMOS transistors 505, 509, 510, and 517 form a current mirror circuit.

A bias voltage of the source follower circuit 503, which is supplied via the wire 520, is controlled by the sample and hold switch 413 and a sample and hold control signal EN_SH. During an A/D conversion period, the bias voltage of the source follower circuit 503 is held in the sample and hold capacitor 412. This prevents noise, generated by a circuit disposed in a stage preceding the source follower circuit 503, from overlapping the reference signal during the A/D conversion (in other words, the output DAC_OUT of the D/A conversion circuit 310).

Here, the thermal noise Vn generated at a transistor and the noise density of 1/f noise Vf are respectively represented in Expressions 1 and 2:

[Math. 1]

$$V_n = \frac{4kT \cdot \gamma \cdot \Delta f}{gm}[V^2/\text{Hz}] \qquad \text{Expression 1}$$

[Math. 2]

$$V_f = \frac{K}{C_{ox} \cdot W \cdot L \cdot \Delta f}[V^2/\text{Hz}] \qquad \text{Expression 2}$$

Here, k represents the Boltzmann constant, T represents a temperature, γ represents a fitting coefficient by a gate length of a transistor, gm represents a conductance of the transistor, K represents a coefficient which depends on a process, Cox represents a gate oxide film capacitance of the transistor, W represents a gate width of the transistor, L represents a gate length of the transistor, and Δf represents a unit interval of frequency.

Moreover, the noise power $V_n^2$ of thermal noise, which is held through a sample and hold operation and sampled by the sample and hold capacitor 412, can be represented in Expression 3:

[Math. 3]

$$V_n^2 = kT/C \qquad \text{Expression 3}$$

Here, C represents a capacitance of the sample and hold capacitor 412 that samples a signal.

In other words, when the bias voltage of the source follower circuit 503 is sampled, the thermal noise and the 1/f noise lose frequency components. Moreover, the noise power to be sampled can be treated as an offset. Furthermore, the noise power can be reduced when the capacitance of the sample and hold capacitor 412 is increased. In the solid-state imaging device 301, signal processing such as the CDS makes it possible to remove the offset component. In other words, it is an effect of noise, which is generated at a stage preceding the sample and hold switch 413 that applies the sample and hold operation, on the output SF_OUT of the source follower circuit 503 that can be removed.

Figure 6:
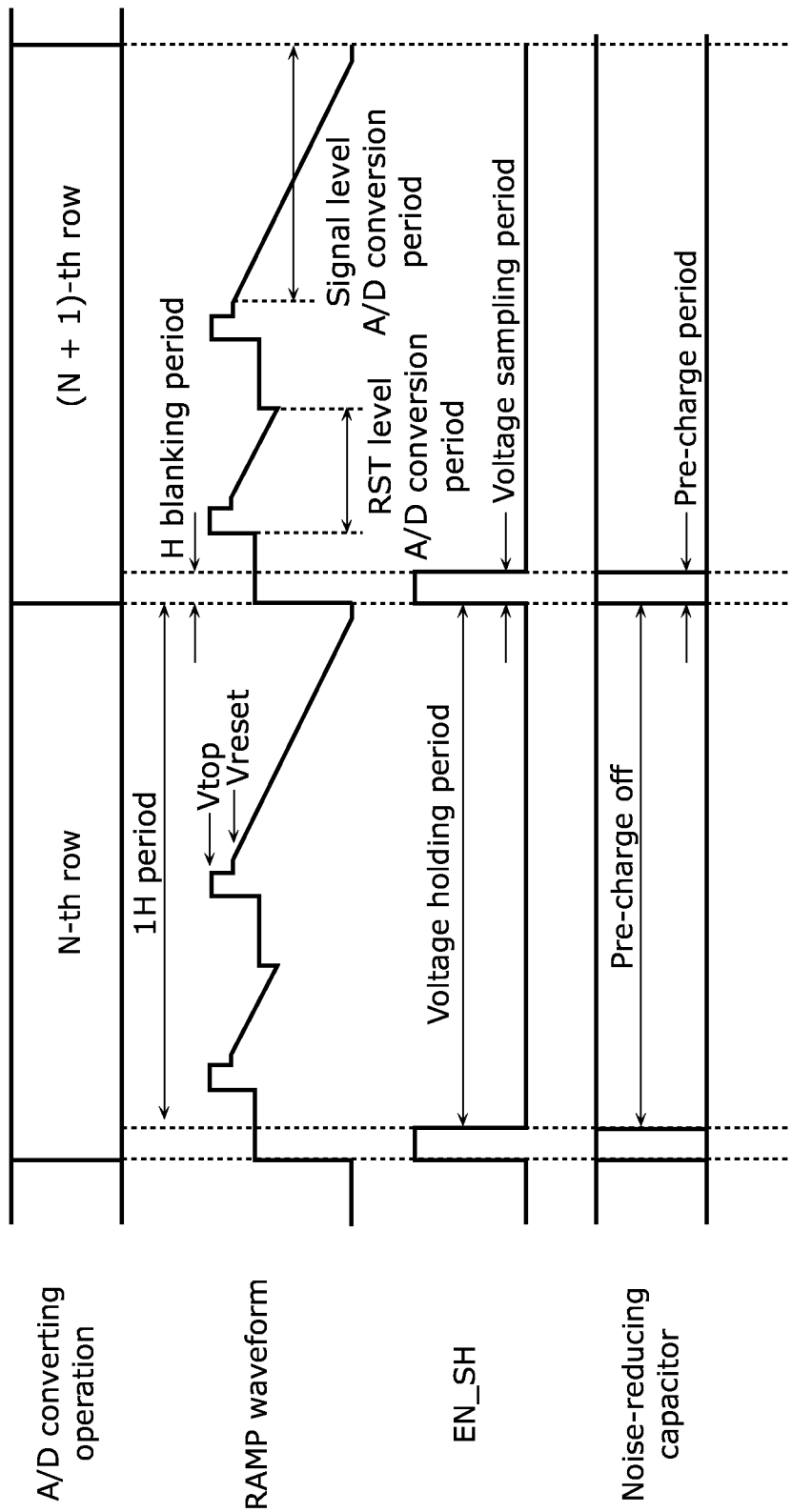
FIG. 6 is a timing diagram illustrating an operation of the D/A converting circuit illustrated in FIG. 4.

FIG. 6 is a timing diagram illustrating an operation of the D/A conversion circuit 310 illustrated in FIG. 4. Here, FIG. 6 illustrates: a row included in the pixel unit 302 and being subject to an A/D conversion during 2H (two horizontal scanning) periods ("A/D converting operation"); a waveform of a reference voltage in the A/D conversion ("RAMP waveform"); a state of the sample and hold control signal EN_SH ("EN_SH"); and a state of noise-reducing capacitor 313 ("noise-reducing capacitor").

The reference voltage for the A/D conversion is outputted from the D/A conversion circuit 310, and inputted into the comparators 307 each provided to a corresponding one of the columns of the pixel unit 302. During the 1H (1 horizontal scanning) period, a reset (RST) level and a signal level are converted from analog into digital. During the period, the sample and hold control signal EN_SH is kept at a Low (L) level. As a result, the sample and hold switch 413 turns off, and the bias voltage of a source follower is held in the sample and hold capacitor 412. Concurrently, the noise generated in a stage preceding the source follower circuit 503 is blocked from the output DAC_OUT of the D/A conversion circuit 310. During the holding period, the potential at the control terminal (gate) of the resistor-ladder-side noise-reducing capacitor connecting switch 408 is kept at a High (H) level. As a result, the resistor-ladder-side noise-reducing capacitor connecting switch 408 turns on and the noise-reducing capacitor 313 is connected to the resistor ladder unit 401. Such operations make it possible to reduce noise which appears in the output DAC_OUT of the D/A conversion circuit 310. Concurrently, the potential at the control terminal (gate) of the amplifier-side noise-reducing capacitor connecting switch 407 is fixed at the L-level. As a result, the amplifier-side noise-reducing capacitor connecting switch 407 turns off, and the noise-reducing capacitor 313 is disconnected from the pre-charge amplifier 406.

Then, the sample and hold control signal EN_SH transits to the H-level during the H (horizontal) blanking period. As a result, the sample and hold switch 413 turns on, and the bias voltage of the source follower is sampled in the sample and hold capacitor 412 via a feedback loop of the resistor ladder upper voltage supplying buffer circuit 403. During the sampling period, the potential at the control terminal (gate) of the resistor-ladder-side noise-reducing capacitor connecting switch 408 is kept at the L-level. As a result, the resistor-ladder-side noise-reducing capacitor connecting switch 408 turns off, and the noise-reducing capacitor 313 does not follow (is not connected to) a feedback loop connected from the output to the inverted input terminal of the resistor ladder upper voltage supplying buffer circuit 403 via the resistor ladder end Vtop, the resistor ladder, and the resistor ladder middle Vreset terminal. Such features make it possible to improve the response of the feedback loop and reduce the time for a voltage sampling period. Concurrently, the voltage at the control terminal (gate) of the amplifier-side noise-reducing capacitor connecting switch 407 transits to the H-level. As a result, the amplifier-side noise-reducing capacitor connecting switch 407 turns on, and, through the pre-charge amplifier 406, the noise-reducing capacitor 313 is pre-charged at a potential Vstart=Vreset which is to be originally biased. It is noted that, in the H (horizontal) blanking period, stabilization of the feedback loop and the pre-charge of the noise-reducing capacitor are quickly performed also at a change in slope of a ramp waveform, such as a change in gain.

Hence, the sample and hold operation and the pre-charge operation are controlled by the sample and hold control signal EN_SH and an inverted signal (an output signal from the inverter 410) of the sample and hold control signal EN_SH. Such a feature makes it possible to reduce noise and increase an operation speed without increasing the number of the control signal lines of the D/A conversion circuit 310.

As described above, the noise-reducing capacitor 313 and the pre-charge circuit are introduced in Embodiment 1 for the sample and hold operation, which makes it possible to achieve a balance between reduction in random row noise and increase in operation speed. Moreover, the control of the sample and hold and the pre-charge in the driving in Embodiment 1 can be achieved by the sample and hold control signal EN_SH alone that has already been implemented in the conventional technique. Hence, additional signal wiring is unnecessary because of the introduction of the pre-charge circuit. Thus, not only the D/A conversion circuit 310 but also the solid-state imaging device 301 including the D/A conversion circuit 310 in Embodiment 1 can be formed small in layout area and package size.

It is noted that the resistor ladder upper voltage supplying buffer circuit 403 in Embodiment 1 is a folded cascode circuit having the source follower circuit 503 as an output unit; instead, the resistor ladder upper voltage supplying buffer circuit 403 may be a buffer circuit to be designed other than the folded cascode circuit. Furthermore, the sample and hold operation is performed only on the gate (in other words, the wire 521) of the transistor 517 included in the source follower circuit 503; instead, the sample and hold operation may also be performed on the gate (in other words, the wire 519) of the transistor 518 or to both the gates. Moreover, the amplifier circuit 502 and the source follower circuit 503 may be different in configuration, depending on the range of a required voltage.

Embodiment 2

Next, a solid-state imaging device according to Embodiment 2 of the present disclosure is described.

The solid-state imaging device according to Embodiment 2 is different from the solid-state imaging device according to Embodiment 1 only in the D/A converting circuit included in the devices. In other words, the basic configuration of the solid-state imaging device according to Embodiment 2 is similar to the one illustrated in the block diagram in FIG. 3. Hereinafter, only the differences between the embodiments are described.

Figure 7:
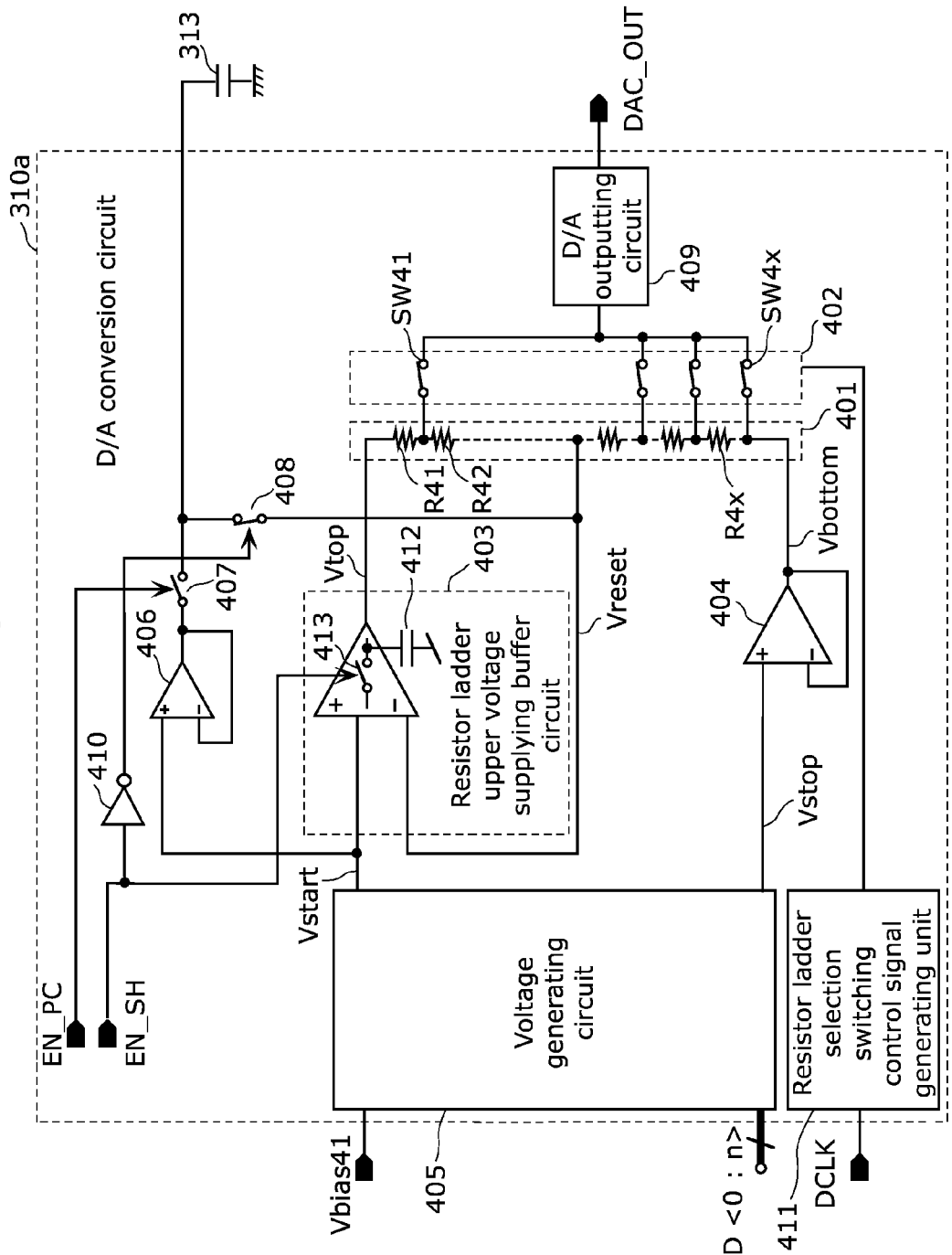
FIG. 7 is a diagram illustrating an exemplary configuration of a D/A converting circuit included in the solid-state imaging device according to Embodiment 2 of the present disclosure.

FIG. 7 is a diagram illustrating an exemplary configuration of a D/A converting circuit 310a included in the solid-state imaging device according to Embodiment 2 of the present disclosure. Compared with the D/A conversion circuit 310 according to Embodiment 1 in FIG. 4, the D/A converting circuit 310a is different in the configuration of a pre-charge circuit.

As a pre-charge circuit, the D/A converting circuit 310a according to Embodiment 2 includes: the pre-charge amplifier 406; the amplifier-side noise-reducing capacitor connecting switch 407; the resistor-ladder-side noise-reducing capacitor connecting switch 408; and the inverter 410. A pre-charge operation is controlled by the sample and hold control signal EN_SH and a pre-charge control signal EN_PC.

The sample and hold control signal EN_SH is supplied to the sample and hold switch 413, and an inverted signal, of the sample and hold control signal EN_SH, obtained via the inverter 410 is supplied to the resistor-ladder-side noise-reducing capacitor connecting switch 408. The pre-charge control signal EN_PC is supplied to the amplifier-side noise-reducing capacitor connecting switch 407.

Figure 8:
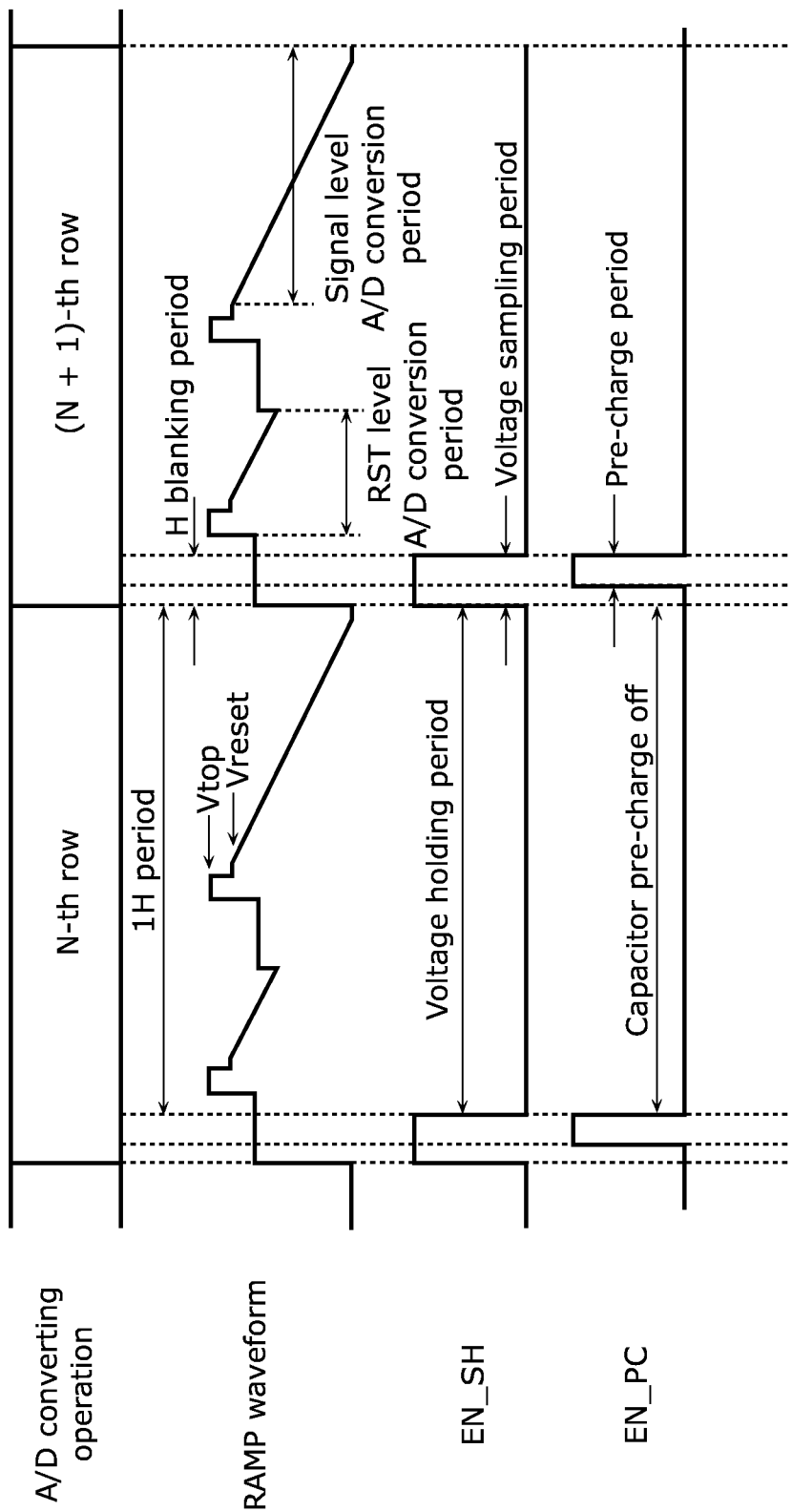
FIG. 8 is a timing diagram illustrating an operation of the D/A converting circuit illustrated in FIG. 7.

FIG. 8 is a timing diagram illustrating an operation of the D/A converting circuit 310a illustrated in FIG. 7. Here, FIG. 6 illustrates: a row included in the pixel unit 302 and being subject to an A/D conversion during 2H (two horizontal scanning) periods ("A/D converting operation"); a waveform of a reference voltage in the A/D conversion ("RAMP waveform"); a state of the sample and hold control signal EN_SH ("EN_SH"); and a wave form of a state of pre-charge control signal EN_PC ("EN_PC").

When the sample and hold control signal EN_SH transits from the L-level to the H-level, the resistor-ladder-side noise-reducing capacitor connecting switch 408 turns off. As a result, the noise-reducing capacitor 313 is disconnected from the resistor ladder middle Vreset terminal. Then, while a load of a feedback loop in the resistor ladder upper voltage supplying buffer circuit 403 becomes light, the sample and hold switch 413 turns on in the resistor ladder upper voltage supplying buffer circuit 403, and a bias voltage is sampled in the sample and hold capacitor 412. Here, the amplifier-side noise-reducing capacitor connecting switch 407 is off since the pre-charge control signal EN_PC is at the L-level.

Next, the pre-charge control signal EN_PC transits from the L-level to the H-level. As a result, the amplifier-side noise-reducing capacitor connecting switch 407 turns on and the noise-reducing capacitor 313 is pre-charged by the pre-charge amplifier 406 at the potential Vstart. Then, as soon as the sampling period ends, the sample and hold control signal EN_SH and the pre-charge control signal EN_PC transit to the L-level. Thus, the sampling period ends, and the holding period starts. The amplifier-side noise-reducing capacitor connecting switch 407 is off during the holding period. This prevents noise, generated in a stage preceding the amplifier-side noise-reducing capacitor connecting switch 407, from propagating to the output DAC_OUT of the D/A converting circuit 310a. Moreover, since the amplifier-side noise-reducing capacitor connecting switch 407 is off, the noise-reducing capacitor 313 is not pre-charged. In contrast, the resistor-ladder-side noise-reducing capacitor connecting switch 408 turns on. As a result, the noise-reducing capacitor 313 is connected to the resistor ladder unit 401, and noise outputted from the output DAC_OUT of the D/A converting circuit 310a is reduced.

Since the noise-reducing capacitor 313 and the pre-charge circuit are introduced in Embodiment 2 for a sample and hold operation, the resistor ladder upper voltage supplying buffer circuit 403 can be designed to specifically achieve lower noise, without concern for speed performance. In addition to the sample and hold operation, the lower noise of the resistor ladder upper voltage supplying buffer circuit 403 makes it possible to reduce random row noise and allows the pre-charge circuit to operate faster. Such features can achieve a balance between reduction in noise and increase in speed. Moreover, compared with Embodiment 1, Embodiment 2 requires an extra signal line for the pre-charge control signal EN_PC; however, Embodiment 2 allows a pre-charge period to be arbitrarily controlled, regardless of a sampling period controlled by the sample and hold control signal EN_SH. Hence, Embodiment 2 obtains an effect in reduction of power consumption, in addition to the effects obtained in Embodiment 1.

Moreover, the pre-charge circuit charges the noise-reducing capacitor 313 at a desired potential in such a case where power of a sensor is turned on. Such a feature makes it possible to achieve an effect in quick turn-on of the sensor.

It is noted that, in relation to the pre-charge circuit in Embodiments 1 and 2, a circuit which arbitrarily sets the sampling period and the pre-charge period may be provided, depending (i) on the capacitance of the sample and hold capacitor 412 and the current drivability of the resistor ladder upper voltage supplying buffer circuit 403, and (ii) on the capacitance of the noise-reducing capacitor 313 and the current drivability of the pre-charge amplifier 406.

Embodiment 3

The solid-state imaging devices according to the above-described Embodiments 1 and 2 are applicable to video cameras and digital still cameras, as well as to imaging devices (image input apparatuses) for imaging apparatuses such as camera modules for mobile devices including cellular phones.

Figure 9:
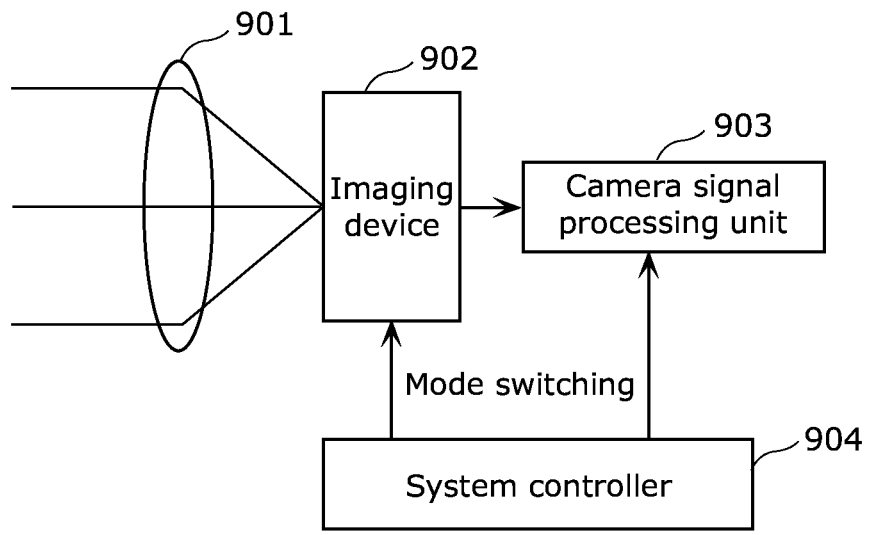
FIG. 9 is a diagram illustrating an exemplary configuration of a camera according to Embodiment 3 of the present disclosure.

FIG. 9 is a diagram illustrating an exemplary configuration of a camera according to Embodiment 3 of the present disclosure.

In addition to an imaging device 902, the camera according to Embodiment 3 includes a lens 901 as an optical system which introduces incident light (forms an object image) into a pixel area of the imaging device 902. The lens 901 focuses, for example, incident light (image light) on an imaging area. Furthermore, this camera includes a system controller 904 which drives the imaging device 902, and a camera signal processing unit 903 which processes an output signal of the imaging device 902.

The imaging device 902 obtains an image signal by converting image light, focused by the lens 901 on the imaging area, into an electric signal for each of pixels, and outputs the image signal. The solid-state imaging device according to one of Embodiment 1 and Embodiment 2 is used as this imaging device 902.

The camera signal processing unit 903 performs various kinds of signal processing on the image signal outputted from the imaging device 902. The system controller 904 controls the imaging device 902 and the camera signal processing unit 903.

The image signal processed by the camera signal processing unit 903 is stored in a storage medium such as a memory, for example. The image information stored in the storage medium is printed out by a printer etc. Moreover, the image signal processed by the camera signal processing unit 903 is displayed as a video on a monitor such as a liquid crystal display.

As described above, the solid-state imaging device 301 as the imaging device 902 may be included in an imaging apparatus, such as a digital still camera. This can implement a camera having high accuracy.

Moreover, the present disclosure is not limited to the above embodiments. Various modifications are applicable to the present disclosure, and such modifications are included in the scope of the present disclosure.

It is noted that the solid-state imaging device of the present disclosure shall not be limited to the embodiments described above. The present disclosure may include (i) another embodiment implemented by a combination of any given constituent elements in each of the embodiments, (ii) a modification at which those with ordinary skill in the art would arrive from each of the embodiments unless otherwise departing from the effects of the present disclosure, and which is obtained through various changes, such as an organic laminated film sensor and a back-illuminated sensor, and (iii) various appliances including the solid-state imaging device of the present disclosure.

INDUSTRIAL APPLICABILITY

A solid-state imaging device of the present disclosure can achieve a balance between reduction in random row noise and increase in operation speed, and is beneficial in use for digital video cameras, digital still cameras, and cellular phones.

The invention claimed is:
1. A solid-state imaging device comprising:
a pixel unit having pixels arranged in a matrix, the pixels performing photoelectric conversion;
a read-out circuit which reads out pixel signals from the pixel unit for each of groups of the pixels, and performs an analog-to-digital (A/D) conversion on the read pixel signals; and
a digital-to-analog (D/A) converting circuit which generates a reference voltage to be used for the A/D conversion by the read-out circuit, the D/A converting circuit including:
a voltage generating circuit which receives a bias voltage, and generates an analog voltage according to a value of an inputted digital signal;
a buffer circuit which buffers the generated analog voltage, the buffer circuit sampling and holding a bias voltage generated inside the buffer circuit, and outputting the buffered analog voltage using the held bias voltage;
an analog signal output circuit which outputs the reference voltage by receiving an output from the buffer circuit and generating an output voltage according to the inputted digital signal; and
a pre-charge circuit which charges a noise-reducing capacitor in conjunction with the sampling and holding, the noise-reducing capacitor being coupled to the buffer circuit or the analog signal output circuit.

2. The solid-state imaging device according to claim 1, wherein the buffer circuit includes:
a bias voltage supply circuit which supplies the bias voltage;
a sample and hold circuit which samples and holds the supplied bias voltage, and outputs the held bias voltage;
an amplifier circuit which amplifies the analog voltage generated by the voltage generating circuit; and
an output circuit which outputs a signal according to an output from the amplifier circuit, under control by the bias voltage outputted from the sample and hold circuit.

3. The solid-state imaging device according to claim 2, wherein the sample and hold circuit includes:
a sample and hold switch coupled between a bias line and a control terminal of the output circuit, the bias line supplying the bias voltage from the bias voltage supply circuit; and
a sample and hold capacitor coupled to the control terminal of the output circuit, and
during a sampling period, the sample and hold circuit keeps the sample and hold switch on, and charges the sample and hold capacitor with the bias voltage.

4. The solid-state imaging device according to claim 1, wherein the analog signal output circuit includes:
a resistor ladder circuit which receives the output from the buffer circuit;
a resistor ladder selection switching circuit which selects any one of connection points in the resistor ladder circuit; and
a D/A outputting circuit which outputs a voltage at the selected one of the connection points, and the analog signal output circuit is configured to receive the inputted digital signal and a voltage applied across the resistor ladder circuit, and to output a voltage resistively divided by the resistor ladder circuit and corresponding to the digital signal.

5. The solid-state imaging device according to claim 1, wherein the pre-charge circuit includes:
a pre-charge amplifier which charges the noise-reducing capacitor;
a first switch which couples the pre-charge amplifier with the noise-reducing capacitor;
a second switch which couples the buffer circuit or the analog signal output circuit with the noise-reducing capacitor; and
a logic circuit which controls the first switch and the second switch, in conjunction with the sampling and holding by the buffer circuit,
during a holding period in the sampling and holding, the pre-charge circuit couples the analog signal output circuit or the buffer circuit to the noise-reducing capacitor, and
during a sampling period in the sampling and holding, the pre-charge circuit (i) uncouples the analog signal output circuit and the buffer circuit from the noise-reducing capacitor, and (ii) causes the pre-charge amplifier to charge the noise-reducing capacitor.

6. The solid-state imaging device according to claim 1, wherein the read-out circuit includes:
comparators each of which is provided to a corresponding one of columns of the pixels in the pixel unit, and compares the reference voltage with a potential of each of the pixel signals outputted from the pixels of the corresponding one of the columns;
counters each of which is a circuit provided to a corresponding one of the comparators, each of the counters (i) counting a comparison time at a corresponding one of the comparators, and (ii) stopping the counting when an output of the corresponding one of the comparators inverts; and
digital memories each of which is provided to a corresponding one of the counters and holds a count value of the corresponding one of the counters.

7. A camera comprising:
the solid-state imaging device according to claim 1; and
an optical system which forms an object image in the solid-state imaging device.

* * * * *